(12) United States Patent
Cheng (10) Patent No.: US 11,978,826 B2
(45) Date of Patent: May 7, 2024

(54) SEMICONDUCTOR STRUCTURES AND SUBSTRATES THEREOF, AND METHODS OF MANUFACTURING SEMICONDUCTOR STRUCTURES AND SUBSTRATES THEREOF

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 562 days.

(21) Appl. No.: 17/273,295

(22) PCT Filed: Jan. 9, 2020

(86) PCT No.: PCT/CN2020/071181
§ 371 (c)(1),
(2) Date: Mar. 3, 2021

(87) PCT Pub. No.: WO2021/138871
PCT Pub. Date: Jul. 15, 2021

(65) Prior Publication Data
US 2022/0131037 A1   Apr. 28, 2022

(51) Int. Cl.
*H01L 33/20* (2010.01)
*H01L 27/15* (2006.01)
*H01L 33/00* (2010.01)
*H01L 33/06* (2010.01)

(52) U.S. Cl.
CPC ............ *H01L 33/20* (2013.01); *H01L 27/156* (2013.01); *H01L 33/005* (2013.01); *H01L 33/06* (2013.01)

(58) Field of Classification Search
None
See application file for complete search history.

(56) References Cited

U.S. PATENT DOCUMENTS

| | | | | |
|---|---|---|---|---|
| 8,981,397 B2* | 3/2015 | Huang | ............... | H01L 33/0066 257/79 |
| 10,211,367 B2* | 2/2019 | Chang | ................ | H01L 33/10 |
| 2008/0251807 A1 | 10/2008 | Yoon | | |
| 2008/0273562 A1* | 11/2008 | Hasegawa | ........... | H01S 5/04254 372/44.01 |
| 2009/0200563 A1* | 8/2009 | Goshonoo | .............. | H01L 33/20 257/88 |

(Continued)

FOREIGN PATENT DOCUMENTS

| | | |
|---|---|---|
| CN | 106784194 A | 5/2017 |
| CN | 107331743 A | 11/2017 |

*Primary Examiner* — Michelle Mandala
(74) *Attorney, Agent, or Firm* — Christopher R. Carroll; The Small Patent Group LLC (57) ABSTRACT

This application provides a semiconductor structure and substrate thereof, a method of manufacturing the semiconductor structure and substrate thereof. The substrate includes a plurality of unit areas, each of the unit areas includes at least two subunit areas, each of the subunit areas is provided with a groove, the groove is opened from a back side of the substrate; and in one of the unit areas, preset opening ratios of the subunit areas are different. A light-emitting layer is grown on a front side of the substrate; and in one of the unit areas, light-emitting wavelengths of the light-emitting layer in the subunit areas are different.

20 Claims, 9 Drawing Sheets

(56) References Cited

U.S. PATENT DOCUMENTS

| | | | |
|---|---|---|---|
| 2013/0313596 A1* | 11/2013 | Fu | H01L 33/22 |
| | | | 257/98 |
| 2015/0171266 A1* | 6/2015 | Li | H01L 21/268 |
| | | | 438/47 |
| 2015/0325598 A1* | 11/2015 | Pfeffer | H01L 25/167 |
| | | | 438/23 |
| 2016/0284927 A1* | 9/2016 | Cho | H01L 33/005 |
| 2016/0365483 A1* | 12/2016 | Xu | H01L 33/22 |
| 2017/0047455 A1* | 2/2017 | Yiu | G01S 7/4813 |
| 2018/0269355 A1 | 9/2018 | Jain et al. | |
| 2020/0118931 A1* | 4/2020 | Garner | H01L 24/25 |

* cited by examiner

FIG. 1

FIG. 2 provide a prefabricated substrate, where the prefabricated substrate comprises a plurality of unit areas, and each of the unit areas includes at least two subunit areas;

open a groove from a back side of the prefabricated substrate in each of the subunit areas, and in one of the unit areas, preset depths of the grooves in the subunit areas are different.

S1 grow a light-emitting layer on a front side of the substrate; where in one of the unit areas, light-emitting wavelengths of the light-emitting layer on the sub-unit areas are different.

FIG. 7 provide a prefabricated substrate, where the prefabricated substrate comprises a plurality of unit areas, and each of the unit areas includes at least two subunit areas;

open a groove from the back side of the prefabricated substrate in each of the sub-unit areas, and in one of the unit areas, the preset depths of the grooves (101) in each of the subunit areas (100a) are different.

FIG. 9 provide a prefabricated substrate, where the prefabricated substrate comprises a plurality of unit areas, and each of the unit areas includes at least two subunit areas;

open a groove from a back side of the prefabricated substrate in each of the subunit areas, and in one of the unit areas, preset depths of the grooves in the subunit areas are different.

fill the groove with a thermally conductive material to form a substrate ⸺ S1' grow a light-emitting layer on a front side of the substrate; where in one of the unit areas, light-emitting wavelengths of the light-emitting layer on the subunit areas are different. ⸺ S2

FIG. 10

FIG. 11 provide a prefabricated substrate, where the prefabricated substrate comprises a plurality of unit areas, and each of the unit areas includes at least two subunit areas;

open a groove from a back side of the prefabricated substrate in each of the subunit areas, and in one of the unit areas, preset depths of the grooves in the subunit areas are different.

fill the groove with a thermally conductive material to form a substrate

SEMICONDUCTOR STRUCTURES AND SUBSTRATES THEREOF, AND METHODS OF MANUFACTURING SEMICONDUCTOR STRUCTURES AND SUBSTRATES THEREOF

CROSS REFERENCE TO RELATED APPLICATIONS

The present application is a U.S. National Phase of International Application No. PCT/CN2020/071181, entitled "SEMICONDUCTOR STRUCTURES AND SUBSTRATES THEREOF, AND METHODS OF MANUFACTURING SEMICONDUCTOR STRUCTURES AND SUBSTRATES THEREOF" and filed on Jan. 9, 2020. The entire contents of the above-listed application are hereby incorporated by reference for all purposes.

TECHNICAL FIELD

This application relates to the field of semiconductor technology, in particular to semiconductor structures and substrates thereof, and methods of manufacturing the semiconductor structures and substrates thereof.

BACKGROUND AND SUMMARY

Light-emitting diodes, or LEDs for short, radiate visible light by means of the recombination of electrons and holes. The two main application areas of LEDs include: lighting and display. Especially in the display field, future development trends include: higher picture quality and higher definition (more pixels and smaller pixel sizes). The key technology to realize high-definition display is to realize ultra-small light-emitting pixels, which requires a smaller-sized full-color LED light-emitting unit.

In the prior art, currently, a size of a full-color LED packaging unit is 1 mm*1 mm. Three formal LED chips, red, green, and blue in color, respectively, are packaged on a PCB through die bonding and wire bonding processes. Then, electrodes of the three types of chips are led out from the back through the conductive via process to form a full-color LED package unit. The full-color LED packaging unit is pressure-welded to a COB flat panel through COB (chip on board) packaging process, and a dot matrix LED display is formed through the row and column wiring on the COB flat panel.

The objective of the present invention is to provide semiconductor structures and substrates thereof, methods of manufacturing the semiconductor structures and the substrates thereof, which can be used for full-color LEDs, and can reduce the size and cost of full-color LEDs.

In order to achieve the above object, a first aspect of the present invention provides a substrate, including a plurality of unit areas, each of the unit areas includes at least two subunit areas, each of the subunit areas is provided with a groove, the groove is opened from a back side of the substrate; and in one of the unit areas, preset opening ratios of the subunit areas are different.

In the present invention, the preset opening ratio of the subunit area refers to the percentage of a total volume of the groove in a subunit area to the volume of the block material of the substrate in the subunit area.

In an optional embodiment of the present disclosure, in one of the unit areas, preset depths of the grooves in the subunit areas are different, and/or preset widths of the grooves in the subunit areas are different, and/or preset opening densities of the grooves in the subunit areas are different.

In an optional embodiment of the present disclosure, the groove is filled with air.

In an optional embodiment of the present disclosure, there is a thermally conductive material in the groove.

In an optional embodiment of the present disclosure, the thermally conductive material is a porous material.

In an optional embodiment of the present disclosure, the larger the preset opening ratio of the subunit area, the larger the porosity of the thermally conductive material in the groove; the smaller the preset opening ratio of the subunit area, the smaller the porosity of the thermally conductive material in the groove.

In an optional embodiment of the present disclosure, thermal conductivities of the thermally conductive materials in the grooves are different.

In an optional embodiment of the present disclosure, the larger the preset opening ratio of the subunit area, the smaller the thermal conductivity of the thermally conductive material in the groove; the smaller the preset opening ratio of the subunit area, the greater the thermal conductivity of the thermally conductive material in the groove.

In an optional embodiment of the present disclosure, the groove is fully filled with the thermally conductive material, or an air gap is formed in the groove.

In an optional embodiment of the present disclosure, the material of the substrate is at least one of sapphire, silicon, silicon carbide, or GaN-based materials.

A second aspect of the present invention provides a semiconductor structure, including:
   the substrate of any one of the above;
   a light-emitting layer located on a front side of the substrate; where in one of the unit areas, light-emitting wavelengths of the light-emitting layer in the subunit areas are different.

In an optional embodiment of the present disclosure, the light-emitting layer includes an N-type semiconductor layer, a P-type semiconductor layer, and a multi-quantum well material layer located between the N-type semiconductor layer and the P-type semiconductor layer.

In an optional embodiment of the present disclosure, the light-emitting layer includes a plurality of alternately arranged N-type semiconductor layers and P-type semiconductor layers, and multi-quantum wells material layers are arranged between adjacent N-type semiconductor layers and P-type semiconductor layers.

In an optional embodiment of the present disclosure, the semiconductor structure is used for display; and the light-emitting layer in each of the unit areas forms a light-emitting unit.

A third aspect of the present invention provides a method of manufacturing a substrate, including:
   providing a prefabricated substrate, where the prefabricated substrate includes a plurality of unit areas, each of the unit areas includes at least two subunit areas; and
   opening a groove from a back side of the prefabricated substrate in each of the subunit areas, and in one of the unit areas, preset opening ratios of the subunit areas are different.

In an optional embodiment of the present disclosure, in one of the unit areas, preset depths of the grooves in the subunit areas are different, and/or preset widths of the grooves in the subunit areas are different, and/or the preset opening densities of the grooves in the subunit areas are different.

In an optional embodiment of the present disclosure, the method further includes: filling the groove with a thermally conductive material.

In an optional embodiment of the present disclosure, the thermally conductive material filled is a porous material.

In an optional embodiment of the present disclosure, the larger the preset opening ratio of the subunit area, the greater the porosity of the thermally conductive material filled in the groove; the smaller the preset opening ratio of the subunit area, the smaller the porosity of the thermally conductive material filled in the groove.

In an optional embodiment of the present disclosure, the thermal conductivities of the thermally conductive materials filled in the grooves are different.

In an optional embodiment of the present disclosure, the larger the preset opening ratio of the subunit area, the smaller the thermal conductivity of the thermally conductive material filled in the groove; the smaller the preset opening ratio of the subunit area, the greater the thermal conductivity of the thermally conductive material filled in the groove.

In an optional embodiment of the present disclosure, in the step of filling the thermally conductive material, the groove is fully filled with the thermally conductive material, or an air gap is formed in the groove.

A fourth aspect of the present invention provides a method of manufacturing a semiconductor structure, including:
manufacturing the substrate according to the manufacturing method described above; and
growing a light-emitting layer on a front side of the substrate; where in one of the unit areas, light-emitting wavelengths of the light-emitting layer in the subunit areas are different.

In an optional embodiment of the present disclosure, the light-emitting layer includes an N-type semiconductor layer, a P-type semiconductor layer, and a multi-quantum well material layer located between the N-type semiconductor layer and the P-type semiconductor layer.

In an optional embodiment of the present disclosure, the light-emitting layer includes a plurality of alternately arranged N-type semiconductor layers and P-type semiconductor layers, and multi-quantum well material layers are arranged between adjacent N-type semiconductor layers and P-type semiconductor layers.

In an optional embodiment of the present disclosure, a band gap of the multi-quantum well material layer becomes wider as the growth temperature becomes higher; the larger the preset opening ratio of the subunit area, the longer the light-emitting wavelength of the light-emitting layer corresponding to the subunit area; the smaller the preset opening ratio of the subunit area, the shorter the light-emitting wavelength of the light-emitting layer corresponding to the subunit area.

In an optional embodiment of the present disclosure, the method of growing the light-emitting layer includes at least one of: atomic layer deposition, chemical vapor deposition, molecular beam epitaxy, plasma enhanced chemical vapor deposition, low-pressure chemical vapor deposition, or metal organic compound chemical vapor deposition.

In an optional embodiment of the present disclosure, the semiconductor structure is used for display; and the light-emitting layer in each of the unit areas forms a light-emitting unit.

Compared with the prior art, the present disclosure has the following beneficial effects:

1) In the method of manufacturing a semiconductor structure of the present invention, a groove is opened from a back side of a prefabricated substrate in each of the subunit areas. The prefabricated substrate includes a plurality of unit areas, each of the unit areas includes at least two subunit areas; and in one of the unit areas, preset opening ratios of the subunit areas are different. During the heat transfer process from the base to the substrate, the heat transfer efficiency of the subunit areas with different preset opening ratio are different. With the influence of the growth temperature on the light-emitting characteristics of the multi-quantum well material layer, when the light-emitting layer is grown on the front side of the substrate, the light-emitting wavelengths of the light-emitting layer on the subunit areas with different preset opening ratios are different. The above process is simple, and a semiconductor structure that can be used for a full-color LED can be fabricated on a substrate, which reduces the size of the full-color LED and reduces the cost.

2) In optional embodiments of the present disclosure, a) the light-emitting layer includes an N-type semiconductor layer, a P-type semiconductor layer, and a multi-quantum well material layer located between the N-type semiconductor layer and the P-type semiconductor layer; or b) the light-emitting layer includes multiple alternately arranged N-type semiconductor layers and P-type semiconductor layers, and multi-quantum well material layers are arranged between adjacent N-type semiconductor layers and P-type semiconductor layers. Compared with the solution a, the solution b can improve the luminous efficiency of the light-emitting layer.

3) In optional embodiments of the present disclosure, the groove is filled with air. For the multi-quantum well material layer whose band gap increases with the increase of the growth temperature, the larger the preset opening ratio of the subunit area, the longer the light-emitting wavelength of the light-emitting layer corresponding to the subunit area; the smaller the preset opening ratio of the subunit area, the shorter the light-emitting wavelength of the light-emitting layer corresponding to the subunit area. The larger the preset opening ratio of the subunit area, the worse the heat transfer efficiency, the lower the temperature of the front side of the substrate, the narrower the band gap of the grown multi-quantum well material layer, and the smaller the frequency and the longer the wavelength of photons generated by electronic transitions. Conversely, the smaller the preset opening ratio of the subunit area, the better the heat transfer efficiency, the higher the temperature of the front side of the substrate, the wider the band gap of the grown multi-quantum well material layer, and the larger the frequency and the shorter the wavelength of photons generated by the electronic transitions.

4) In optional embodiments of the present disclosure, before growing the light-emitting layer on the front side of the substrate, the groove is filled with a thermally conductive material. By controlling the porosity and thermal conductivity of the thermally conductive material, the heat transfer efficiency of the substrate is further adjusted.

5) In optional embodiments of the present disclosure, the semiconductor structure is used for display; and the light-emitting layer in each unit area forms a light-emitting unit. With the above method, the simultaneous production of several light-emitting units arranged in an array can be achieved. In other optional embodiments, multiple semiconductor structures for lighting can also be fabricated at the same time.

To facilitate the understanding of the present disclosure, all reference signs appearing in the present disclosure are listed below:

Prefabricated substrate 10'
Unit area 100
Subunit area 100a
Back side of prefabricated substrate, back side of substrate 10b
Groove 101
Light-emitting layer 20
N-type semiconductor layer 20a
P-type semiconductor layer 20b
Multi-quantum well material layer 20c
front side of prefabricated substrate, front side of substrate 10a
Air Gap 101a
Substrate 10

DETAILED DESCRIPTION

In order to make the above-mentioned objectives, features and advantages of the present disclosure easier to be understood, specific embodiments of the present disclosure will be described in detail below with reference to the accompanying drawings.

Figure 1:
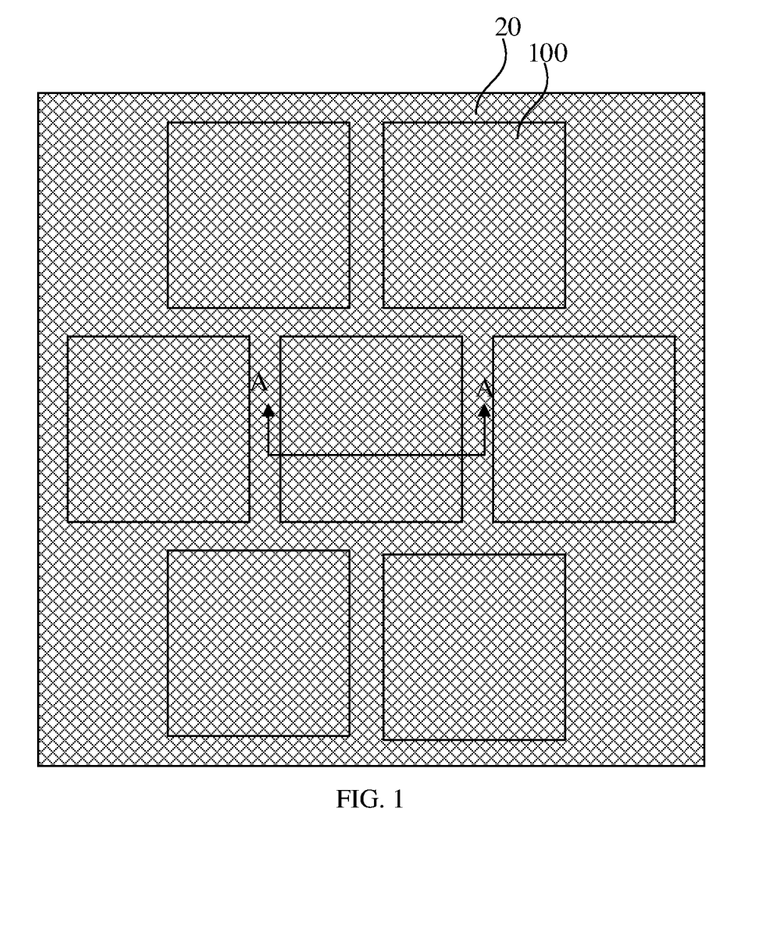
FIG. 1 illustrates a top view of a semiconductor structure according to a first embodiment of the present invention.
Figure 2:
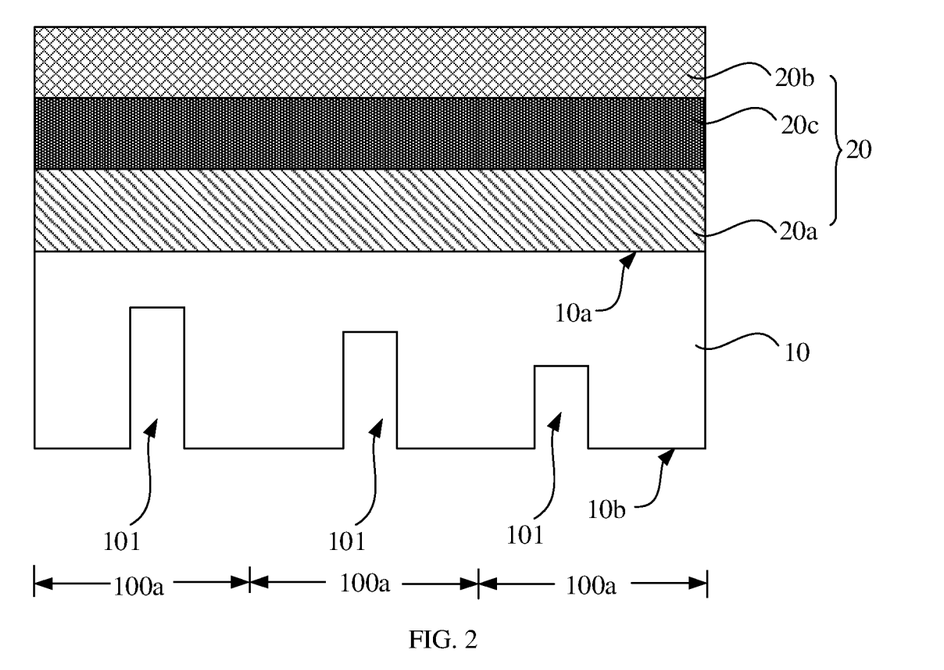
FIG. 2 illustrates a cross-sectional view taken along line AA in FIG. 1.
Figure 3:
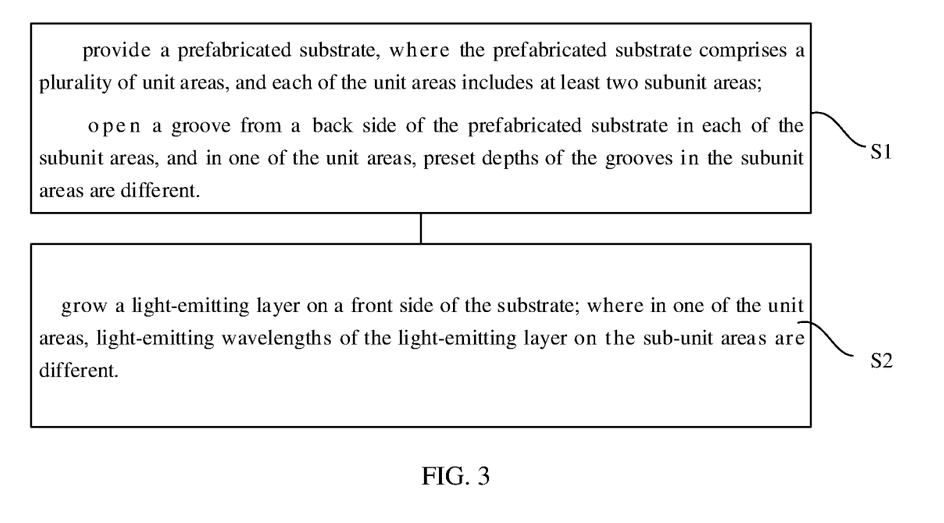
FIG. 3 illustrates a flowchart of a method of manufacturing the semiconductor structure in FIGS. 1 and 2.
Figure 4:
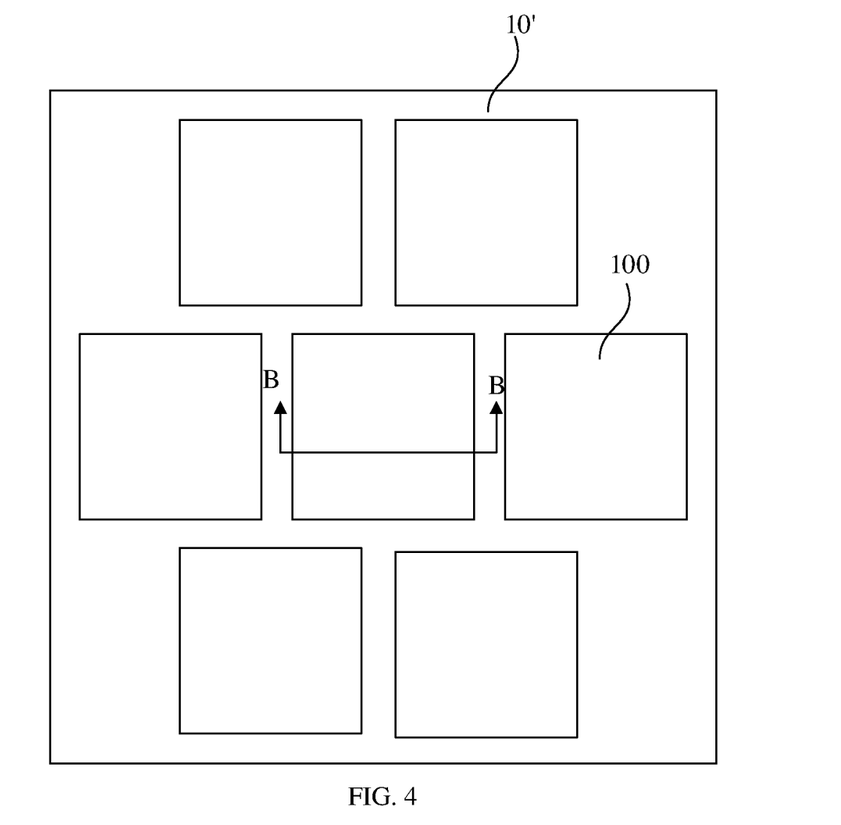
FIG. 4 illustrates a top view of a prefabricated substrate in the process of FIG. 3.
Figure 5:
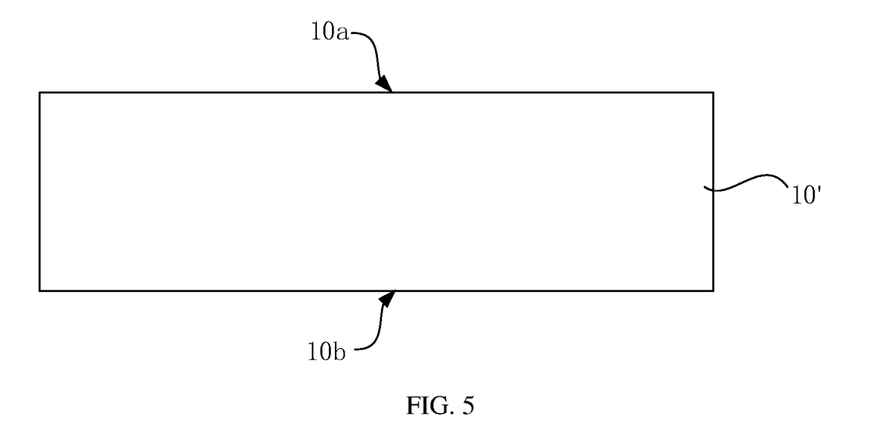
FIG. 5 illustrates a cross-sectional view along line BB in FIG. 4.

FIG. 1 illustrates a top view of a semiconductor structure according to a first embodiment of the present invention, and FIG. 2 illustrates a cross-sectional view along line AA in FIG. 1. FIG. 3 illustrates a flowchart of a manufacturing method of the semiconductor structure in FIG. 1 and FIG. 2. FIG. 4 illustrates a top view of the prefabricated substrate in the process of FIG. 3, and FIG. 5 illustrates a cross-sectional view along the line BB in FIG. 4.

First, referring to step S1 in FIG. 3, FIG. 1, FIG. 2, FIG. 4, and FIG. 5, a prefabricated substrate 10' is provided. The prefabricated substrate 10' includes a plurality of unit areas 100, and each unit area 100 includes at least two subunit areas 100a. A groove 101 is opened in each subunit area 100a from the back side 10b of the prefabricated substrate 10'. In a unit area 100, preset depths of the grooves in each of the subunit areas 100a are different.

The prefabricated substrate 10' may be sapphire, silicon carbide, silicon or GaN-based material.

In this embodiment, the semiconductor structure is used for display. A plurality of unit areas 100 are arranged in an array, each unit area 100 corresponds to a pixel unit area; and each subunit area 100a corresponds to a sub-pixel area. In this step S1, at least two grooves 101 with different preset depths are opened in each pixel unit area.

In other embodiments, semiconductor structures can also be used for lighting. A plurality of unit areas 100 are arranged in an array, each unit area 100 corresponds to a lighting unit area; and each subunit area 100a corresponds to a primary color light-emitting structure area. In this step S1, at least two grooves 101 with different preset depths are opened in each lighting unit area.

In the embodiment shown in FIG. 2, there are preferably three grooves 101, corresponding to the formation of red, green, and blue LED light-emitting structures.

The groove 101 can be formed by dry etching, laser grooving, mechanical grooving, etc. In a unit area 100, difference(s) in the preset depths of the different grooves 101 in each subunit area 100a may be a fixed value or a variable value.

Next, referring to step S2 in FIG. 3, and as shown in FIG. 1 and FIG. 2, a light-emitting layer 20 is grown on the front side 10a of the substrate 10; and in one of the unit areas 100, the light-emitting wavelengths of the light-emitting layer 20 in each subunit area 100a are different.

When growing the light-emitting layer 20, the back side 10b of the substrate 10 is placed on a base in a reaction chamber. A heating device is provided in the base, and the base transfers heat to the substrate 10 to heat the substrate 10 to the growth temperature.

The light-emitting layer 20 may include an N-type semiconductor layer 20a, a P-type semiconductor layer 20b, and a multi-quantum well material layer 20c located between the N-type semiconductor layer 20a and the P-type semiconductor layer 20b.

The material of the N-type semiconductor layer 20a, the multi-quantum well material layer 20c, and the P-type semiconductor layer 20b may be at least one of GaN, AlN, InN, InAlGaN, InAlN, GaAs, or AlGaAs, and the formation process may include: Atomic layer deposition (ALD), or chemical vapor deposition (CVD), or molecular beam epitaxy (MBE), or plasma enhanced chemical vapor deposition (PECVD), or Low Pressure Chemical Vapor Deposition (LPCVD), or Metal-Organic Chemical Vapor Deposition (MOCVD), or a combination thereof.

Before forming the N-type semiconductor layer 20a on the substrate 10, a nucleation layer and a buffer layer (not shown) can be formed in sequence. The material of the nucleation layer can be, for example, AN, AlGaN, etc. The material of the buffer layer may include at least one of AN, GaN, AlGaN, or AlInGaN. The method of forming the buffer layer may be the same as the method of forming the N-type semiconductor layer 20a. The nucleation layer can alleviate the lattice mismatch and thermal mismatch between/among the epitaxially grown semiconductor layers, such as between the N-type semiconductor layer 20a and the multi-quantum well material layer 20c, and between the multi-quantum well material layer 20c and the P-type semiconductor layer 20b, and the buffer layer can reduce the dislocation density and defect density of the epitaxially grown semiconductor layers and improve the crystal quality.

In this step S2, the groove 101 is filled with air, and the thermal conductivity of air is lower than the thermal conductivity of the substrate 10. Therefore, the greater the preset depth of the groove 101 in the subunit area 100a and the larger a preset opening ratio of the subunit area 100a is, the worse the heat transfer efficiency of the subunit area 100a is; the lower the temperature of the front side 10a of the subunit area 100a is. The light-emitting wavelength of the grown multi-quantum well material layer 10c varies with temperature. Specifically, first, in direct bandgap materials, the wavelength is inversely proportional to the band gap; second, band gap of some semiconductor materials has a positive temperature coefficient, that is, when the growth temperature increases, the band gap increases, so the wavelength is inversely proportional to the temperature; while some semiconductor materials have a negative temperature coefficient, that is, when the growth temperature increases, the band gap decreases, so the wavelength is directly proportional to the temperature. For example, the common InGaN is a semiconductor material with a positive temperature coefficient.

The preset opening ratio of the subunit area 100a refers to the percentage of the total volume of the groove 101 in a subunit area 100a to the volume of the substrate material block of the subunit area 100a.

In some embodiments, the P-type semiconductor layer 20b may be close to the substrate 10, and the N-type semiconductor layer 20a may be away from the substrate 10.

In some embodiments, electrical connection structures that electrically connect the N-type semiconductor layer 20a and the P-type semiconductor layer 20b can be further fabricated on the semiconductor structure to form a full-color LED.

In some embodiments, in one unit area 100, the preset width of the groove(s) 101 in each subunit area 100a may be different, or the preset opening density of the groove(s) 101 in each subunit area 100a may be different, so as to adjust the preset opening ratio of each subunit area 100a to be different. The preset opening density refers to the number of grooves 101 per unit volume of the subunit area 100a.

In some embodiments, in a unit area 100, the preset depth of the groove(s) 101 in each subunit area 100a is different, and/or the preset width of the groove(s) 101 in each subunit area 100a is different, and/or the preset opening density of the groove(s) 101 in each subunit area 100a is different, so as to adjust the preset opening ratio of each subunit area 100a to be different. For example, the preset depths of the grooves 101 in two subunit areas 100a are different, and the preset widths (or the preset opening densities) of the grooves 101 in two subunit areas 100a are different from that of another subunit area 100a (or the preset opening densities are different).

For the semiconductor structure used for display, the light-emitting layer 20 grown in each pixel unit area forms a light-emitting unit. For the semiconductor structure used for lighting, it is also possible to cut along the cutting path between adjacent lighting unit areas to form multiple lighting units.

In the manufacturing method of the semiconductor structure of this embodiment, a groove 101 is opened from a back side of a prefabricated substrate 10' in each of the subunit areas 100a. The prefabricated substrate 10' includes a plurality of unit areas 100, and each of the unit areas 100 includes at least two subunit areas 100a. In a unit area 100, preset depths of grooves 101 in each subunit area 100a are different so as to control the preset opening ratios to be different. During the heat transfer process from a base to the substrate 10, heat transfer efficiency of the subunit areas 100a with different preset opening ratios is different. With the influence of the growth temperature on the light-emitting characteristics of the multi-quantum well material layer 20c, when the light-emitting layer 20 is grown on the front side of the substrate 10a, light-emitting wavelengths of different parts of the light-emitting layer 20 corresponding to subunit areas 100a with different preset opening ratios are different. The above process is simple, and a semiconductor structure for a full-color LED can be fabricated on one substrate 10, which reduces the size of the full-color LED and reduces the cost.

Figure 6:
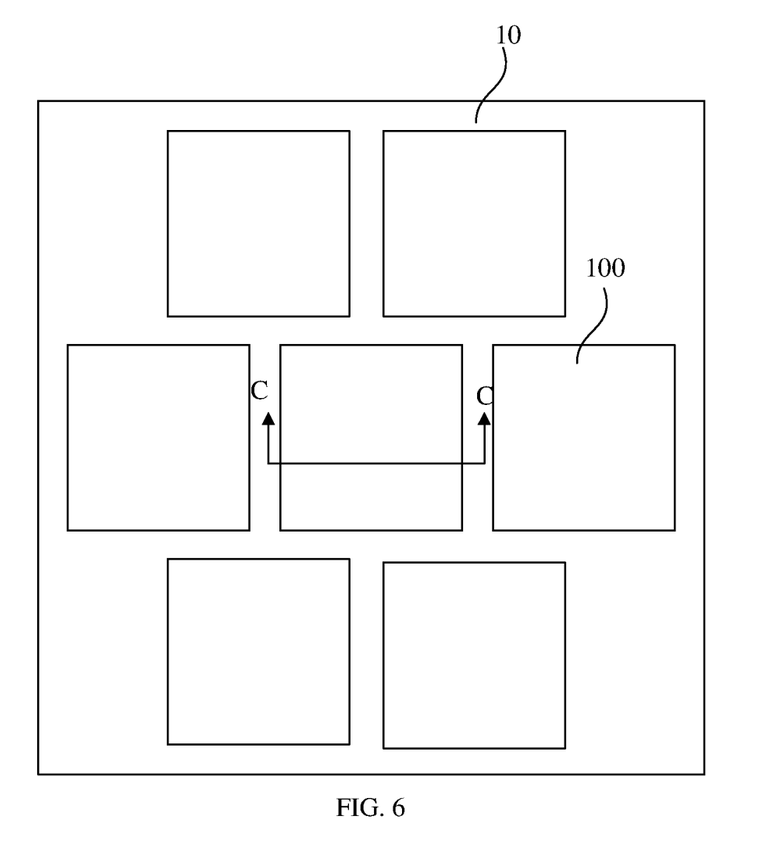
FIG. 6 illustrates a top view of a substrate according to a second embodiment of the present invention.
Figure 7:
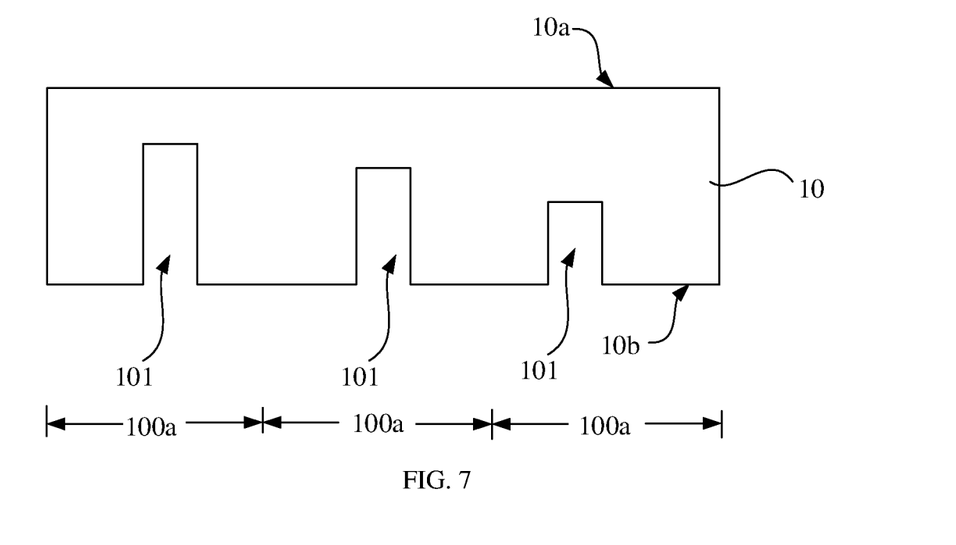
FIG. 7 illustrates a cross-sectional view along line CC in FIG. 6.
Figure 8:
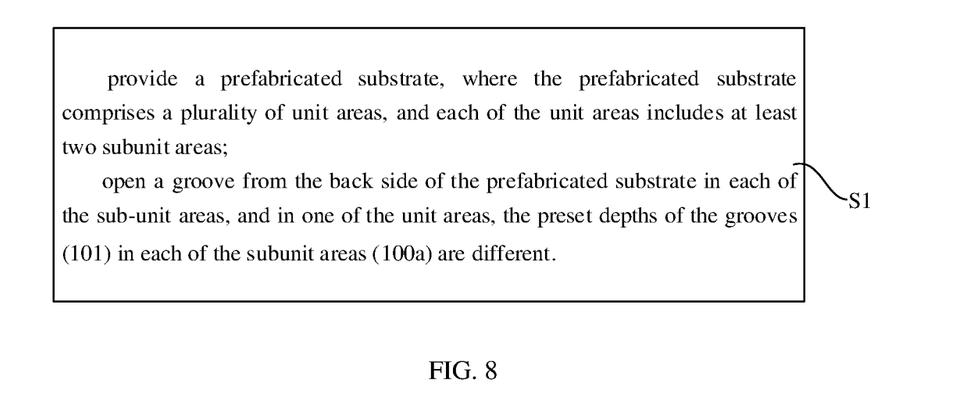
FIG. 8 illustrates a flowchart of a method of manufacturing the substrate in FIGS. 6 and 7.

FIG. 6 illustrates a top view of the substrate according to the second embodiment of the present invention, and FIG. 7 illustrates a cross-sectional view taken along line CC in FIG. 6. FIG. 8 illustrates a flowchart of a method of manufacturing the substrate in FIGS. 6 and 7.

Referring to FIGS. 6 to 8, the substrate and its manufacturing method according to the second embodiment are exactly the same as the substrate in the semiconductor structure and its manufacturing method according to the first embodiment. The substrate in the semiconductor structure and its manufacturing method are all introduced in the second embodiment. The substrate 10 in the semiconductor structure according to the first embodiment can be produced and sold separately.

Figure 9:
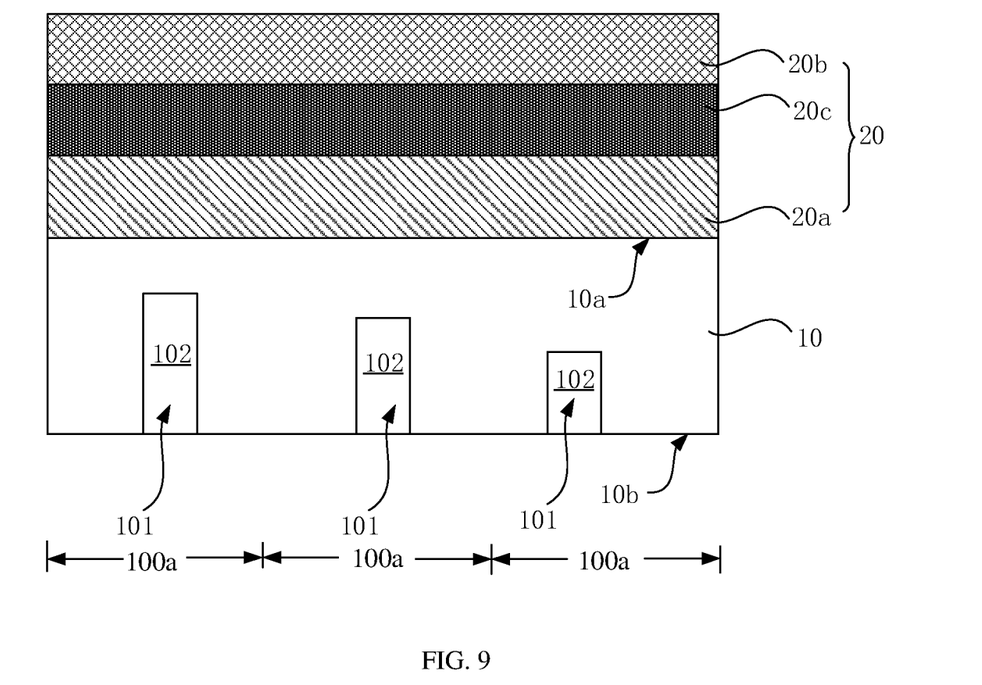
FIG. 9 illustrates a schematic cross-sectional structure diagram of a semiconductor structure according to a third embodiment of the present invention.
Figure 10:
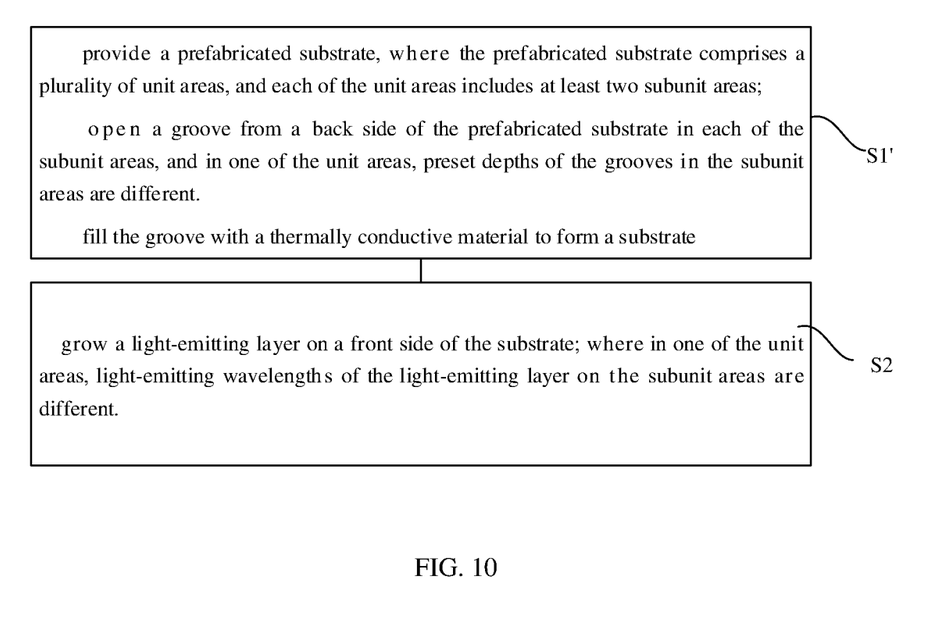
FIG. 10 illustrates a flowchart of a method of manufacturing the semiconductor structure of FIG. 9.

FIG. 9 illustrates a schematic cross-sectional structure diagram of a semiconductor structure according to a third embodiment of the present invention. FIG. 10 is a flowchart of a method of manufacturing the semiconductor structure of FIG. 9.

Referring to FIG. 9 and FIG. 10, the semiconductor structure of the third embodiment is substantially the same as the semiconductor structure of the first embodiment, except that a thermally conductive material 102 is provided in the grooves 101. Correspondingly, the manufacturing method of the semiconductor structure according to the third embodiment is substantially the same as the method of manufacturing the semiconductor structure according to the first embodiment. The only difference is that: in step S1': the grooves 101 are filled with a thermally conductive material 102 to form the substrate 10.

Referring to FIG. 9, in this embodiment, the grooves 101 are filled with the thermal conductive material 102.

In this embodiment, by controlling parameters of the thermally conductive material 102, relative to air, heat transfer efficiency of the subunit areas 100a with different preset opening ratios can be further adjusted, thereby further adjusting light-emitting wavelengths of different parts of a light-emitting layer 20 on the subunit areas 100a with different preset opening ratios.

In some embodiments, the thermally conductive material 102 is a porous material, such as a low-K dielectric layer ($SiO_2$), magnesium oxide (MgO), aluminum oxide ($Al_2O_3$), etc. In a unit area 100, the greater the preset opening ratio of the subunit area 100a is, the greater the porosity of the thermally conductive material 102 filled in the groove 101 in the subunit area 100a may be controlled, so as to further reduce the heat transfer efficiency of the subunit area 100a with the large preset opening ratio; the smaller the preset opening ratio of the subunit area 100a is, the smaller the porosity of the thermally conductive material 102 filled in the groove 101 in the subunit area 100a may be, so as to further improve the heat transfer efficiency of the subunit area 100a with the small preset opening ratio.

In some embodiments, the larger the preset opening ratio of the subunit area 100a is, the smaller the porosity of the thermally conductive material 102 filled in the groove 101 in the subunit area 100a may be controlled; the smaller the preset opening ratio of the subunit area 100a is, the greater the porosity of the thermally conductive material 102 filled in the groove 101 in the subunit area 100a may be controlled, so as to fine-tune the heat transfer efficiency of the subunit areas 100a with different preset opening ratios.

In some embodiments, the porosity of the thermally conductive material 102 filled in the grooves 101 in each subunit area 100a is the same.

In some embodiments, the thermal conductivity of the thermally conductive material 102 filled in the groove 101 in each subunit area 100a is different. In a unit area 100, the larger the preset opening ratio of the subunit area 100a is, the smaller the thermal conductivity of the thermally conductive material 102 filled in the groove 101 in the subunit area 100a is controlled, so as to further reduce the heat transfer efficiency of the subunit area 100a with the large preset opening ratio; the smaller the preset opening ratio of the subunit area 100a is, the greater the thermal conductivity of the thermally conductive material 102 filled in the groove 101 in the subunit area 100a is controlled, so as to further improve heat transfer efficiency of the subunit area 100a with the small preset opening ratio.

In some embodiments, the larger preset opening ratio is, the greater the thermal conductivity of the thermally conductive material 102 may be controlled; the smaller the preset opening ratio, the smaller the thermal conductivity of the filled thermally conductive material 102 may be controlled, so as to fine-tune the heat transfer efficiency of the subunit areas 100a with different preset opening ratios.

In some embodiments, the thermal conductivity of the thermally conductive material 102 filled in the groove 101 in each subunit area 100a is the same.

In some embodiments, in one unit area 100, the grooves 101 in a part of the subunit areas 100a are filled with air, and the grooves 101 of a part of the subunit areas 100a are filled with a thermally conductive material 102.

Figure 11:
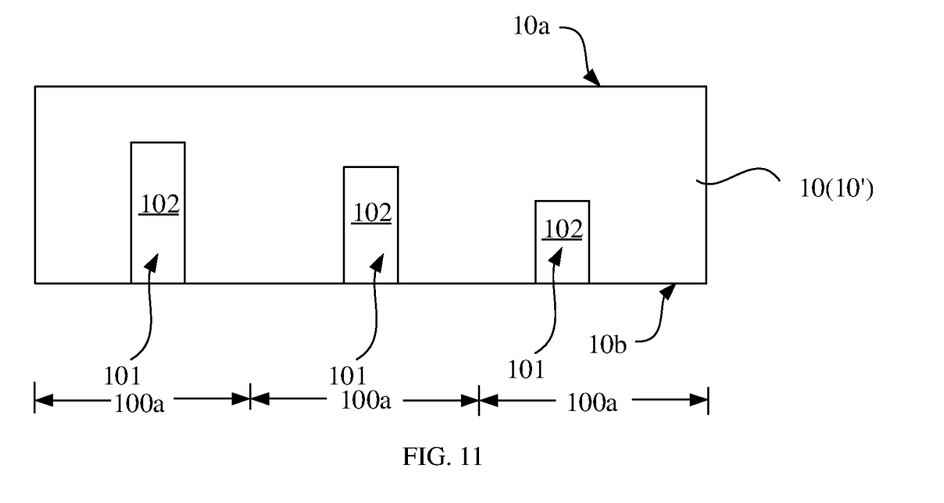
FIG. 11 illustrates a schematic cross-sectional structure diagram of a substrate according to a fourth embodiment of the present invention.
Figure 12:
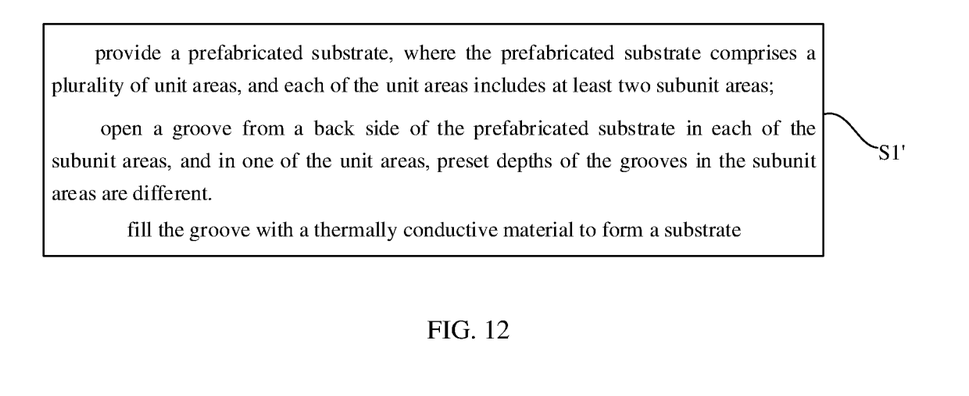
FIG. 12 illustrates a flowchart of a method of manufacturing the substrate in FIG. 11.

FIG. 11 illustrates a schematic cross-sectional structure diagram of a substrate according to a fourth embodiment of the present invention. FIG. 12 illustrates a flowchart of a method of manufacturing the substrate in FIG. 11.

Referring to FIGS. 11 and 12, the substrate and its manufacturing method according to the fourth embodiment are exactly the same as the substrate in the semiconductor structure and its manufacturing method according to the third embodiment, that is, the substrate and its manufacturing method according to the third embodiment are all introduced in the fourth embodiment. The substrate 10 in the semiconductor structure according to the third embodiment can be produced and sold separately.

Figure 13:
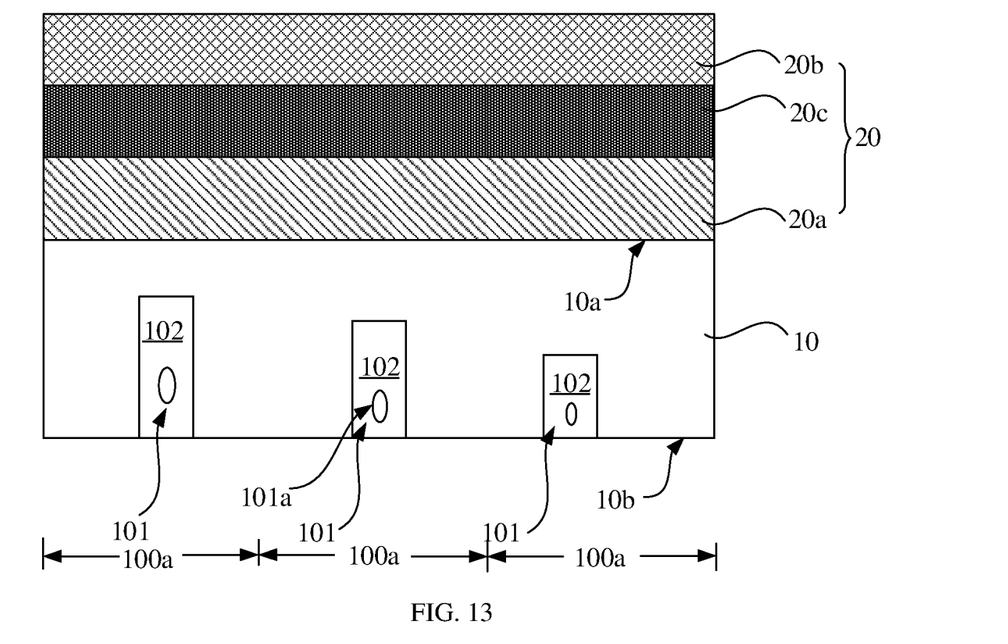
FIG. 13 illustrates a schematic cross-sectional structure diagram of a semiconductor structure according to a fifth embodiment of the present invention.

FIG. 13 illustrates a schematic cross-sectional structure diagram of a semiconductor structure according to a fifth embodiment of the present invention.

Referring to FIG. 13, the semiconductor structure of the fifth embodiment is substantially the same as the semiconductor structure of the third embodiment. The only difference is that an air gap 101a is formed in the groove 101. Correspondingly, the method of manufacturing the semiconductor structure of the fifth embodiment is substantially the same as the method of manufacturing the semiconductor structure of the third embodiment, except that: in step S1', when the thermally conductive material 102 is filled in the grooves 101, air gaps 101a are formed inside the grooves 101.

In the fifth embodiment, the size of the air gap 101a combined with the amount of the thermally conductive material 102 is used to adjust the heat transfer efficiency.

The air gap 101a can be achieved by reducing a bias voltage between a plasma source and the base during the deposition process, or not applying the bias voltage, and/or reducing a pumping rate of the chamber.

Figure 14:
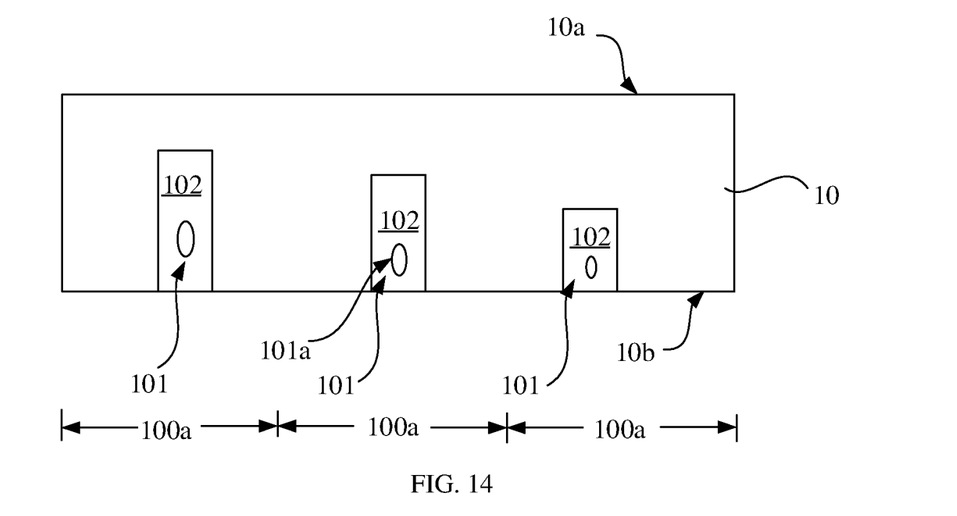
FIG. 14 illustrates a schematic cross-sectional structure diagram of a substrate according to a sixth embodiment of the present invention.

FIG. 14 illustrates a schematic cross-sectional structure diagram of a substrate according to a sixth embodiment of the present invention.

Referring to FIG. 14, the substrate and the manufacturing method thereof in the sixth embodiment are exactly the same as the substrate in the semiconductor structure and its manufacturing method of the fifth embodiment, that is, the substrate in the semiconductor structure and its manufacturing method of the fifth embodiment are all introduced in the sixth embodiment. The substrate 10 in the semiconductor structure of the fifth embodiment can be produced and sold separately.

Figure 15:
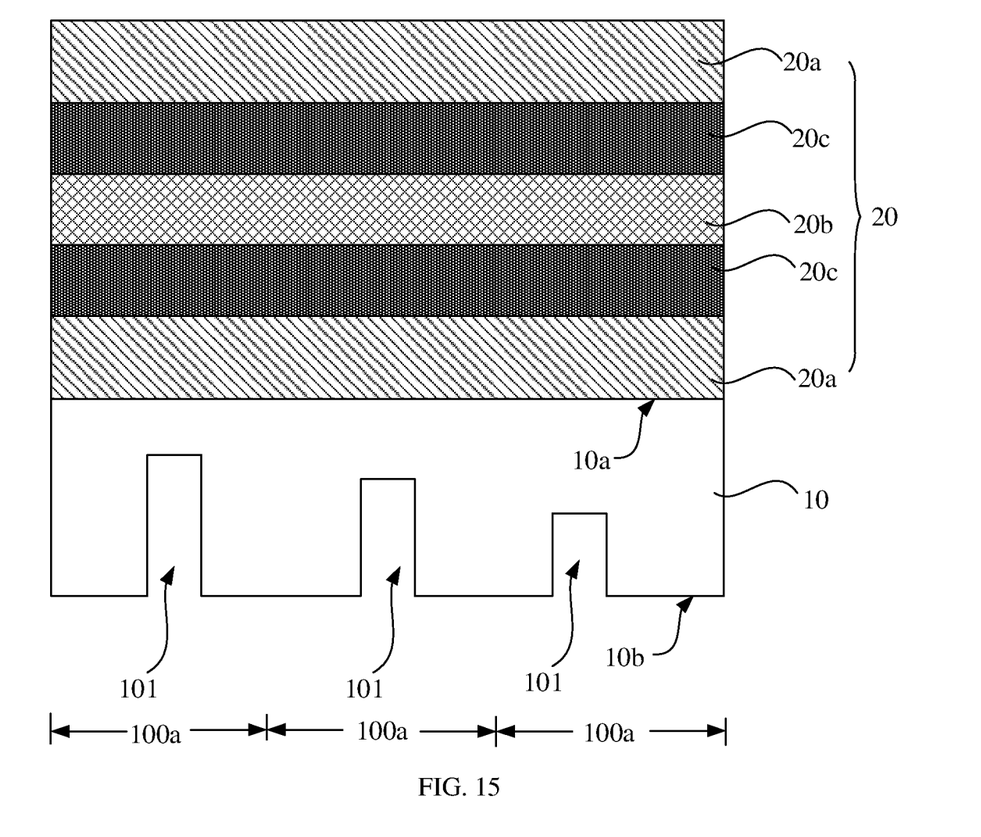
FIG. 15 illustrates a schematic cross-sectional structure diagram of a semiconductor structure according to a seventh embodiment of the present invention.

FIG. 15 illustrates a schematic cross-sectional structure diagram of a semiconductor structure according to a seventh embodiment of the present invention.

Referring to FIG. 15, the semiconductor structure of the seventh embodiment is substantially the same as the semiconductor structures of the first, third, and fifth embodiments. The only difference is that: the light-emitting layer 20 includes multiple alternately arranged N-type semiconductor layers 20a and P-type semiconductor layers 20b, multi-quantum well material layers 20c are arranged between adjacent N-type semiconductor layers 20a and P-type semiconductor layers 20b. Correspondingly, the method of manufacturing the semiconductor structure of the seventh embodiment is substantially the same as the methods of manufacturing the semiconductor structure of the first, third, and fifth embodiments. The only difference is that: in step S2, the grown light-emitting layer 20 includes multiple alternately arranged N-type semiconductor layers 20a and P-type semiconductor layers 20b, and multi-quantum well material layers 20c are arranged between the adjacent N-type semiconductor layers 20a and P-type semiconductor layers 20b.

Compared with the semiconductor structures of the first, third, and fifth embodiments, the semiconductor structure of the seventh embodiment can improve the luminous efficiency of the light-emitting layer 20.

In the present invention, the term "a plurality of/multiple" refers to one, two, or more than two, unless specifically defined otherwise.

Although the present invention is disclosed as above, the present invention is not limited thereto. Any person skilled in the art can make various changes and modifications without departing from the spirit and scope of the present invention. Therefore, the protection scope of the present invention should be subject to the scope defined by the claims.

The invention claimed is:

1. A substrate, comprising a plurality of unit areas, each of the unit areas includes at least two subunit areas, each of the subunit areas is provided with a groove, the groove is opened from a back side of the substrate; and in one of the unit areas, preset opening ratios of the subunit areas are different, such that during a heat transfer process of a base station to the substrate, heat transfer efficiencies of sub-unit areas with different preset aperture ratios are different, enabling that when a light-emitting layer is grown on a front side of the substrate, light-emitting wavelengths of different regions of the light-emitting layer corresponding to different the sub-unit areas with the different preset aperture ratios are different, wherein the preset aperture ratio of the sub-unit area refers to a percentage of a volume of the groove in a sub-unit area to a volume of a block of the substrate in the sub-unit area.

2. The substrate according to claim 1, wherein in one of the unit areas, preset depths of the grooves in the subunit areas are different, and/or preset widths of the grooves in the subunit areas are different, and/or preset opening densities of the grooves in the subunit areas are different.

3. The substrate according to claim 1, wherein the groove is filled with air.

4. The substrate according to claim 1, wherein a material of the substrate is at least one of sapphire, silicon, silicon carbide, or GaN-based materials.

5. A semiconductor structure, comprising
a substrate comprising a plurality of unit areas, each of the unit areas includes at least two subunit areas, each of the subunit areas is provided with a groove, the groove is opened from a back side of the substrate; and in one of the unit areas, preset opening ratios of the subunit areas are different, such that during a heat transfer process of a base station to the substrate, heat transfer efficiencies of sub-unit areas with different preset aperture ratios are different, enabling that when a light-emitting layer is grown on a front side of the substrate, light-emitting wavelengths of different regions of the light-emitting layer corresponding to different the sub-unit areas with the different preset aperture ratios are different, wherein the preset aperture ratio of the sub-unit area refers to a percentage of a volume of the groove in a sub-unit area to a volume of a block of the substrate in the sub-unit area; and
a light-emitting layer located on a front side of the substrate;
wherein in one of the unit areas, light-emitting wavelengths of the light-emitting layer in the subunit areas are different.

6. The semiconductor structure according to claim 5, wherein the light-emitting layer comprises an N-type semiconductor layer, a P-type semiconductor layer, and a multi-quantum well material layer located between the N-type semiconductor layer and the P-type semiconductor layer.

7. The semiconductor structure according to claim 5, wherein the light-emitting layer comprises a plurality of alternately arranged N-type semiconductor layers and P-type semiconductor layers, and multi-quantum well material layers are arranged between adjacent N-type semiconductor layers and P-type semiconductor layers.

8. The semiconductor structure according to claim 5, wherein the semiconductor structure is used for display; and the light-emitting layer in each of the unit areas forms a light-emitting unit.

9. A method of manufacturing a substrate, comprising:
providing a prefabricated substrate, wherein the prefabricated substrate comprises a plurality of unit areas, each of the unit areas includes at least two subunit areas; and
opening a groove from a back side of the prefabricated substrate in each of the subunit areas;
wherein in one of the unit areas, preset opening ratios of the subunit areas are different, such that during a heat transfer process of a base station to the substrate, heat transfer efficiencies of sub-unit areas with different preset aperture ratios are different, enabling that when a light-emitting layer is grown on a front side of the substrate, light-emitting wavelengths of different regions of the light-emitting layer corresponding to different the sub-unit areas with the different preset aperture ratios are different, wherein the preset aperture ratio of the sub-unit area refers to a percentage of a volume of the groove in a sub-unit area to a volume of a block of the substrate in the sub-unit area.

10. The method of manufacturing a substrate according to claim 9, wherein in one of the unit areas, preset depths of the grooves in the subunit areas are different, and/or preset widths of the grooves in the subunit areas are different, and/or preset opening densities of the grooves in the subunit areas are different.

11. A method of manufacturing a semiconductor structure, comprising:
manufacturing the substrate according to the manufacturing method of claim 9; and
growing a light-emitting layer on a front side of the substrate;
wherein in one of the unit areas, light-emitting wavelengths of the light-emitting layer in the subunit areas are different.

12. The method of manufacturing a semiconductor structure according to claim 11, wherein the light-emitting layer comprises an N-type semiconductor layer, a P-type semiconductor layer, and a multi-quantum well material layer located between the N-type semiconductor layer and the P-type semiconductor layer.

13. The method of manufacturing a semiconductor structure according to claim 11, wherein the light-emitting layer comprises a plurality of alternately arranged N-type semiconductor layers and P-type semiconductor layers, and multi-quantum well material layers are arranged between adjacent N-type semiconductor layers and P-type semiconductor layers.

14. The method of manufacturing a semiconductor structure according to claim 12, wherein a band gap of the multi-quantum well material layer becomes wider as a growth temperature becomes higher; a larger a preset opening ratio of a subunit area, a longer a light-emitting wavelength of the light-emitting layer corresponding to the sub-unit area; a smaller the preset opening ratio of the subunit area, a shorter the light-emitting wavelength of the light-emitting layer corresponding to the subunit area.

15. The method of manufacturing a semiconductor structure according to claim 11, wherein the semiconductor structure is used for display; and the light-emitting layer in each of the unit areas forms a light-emitting unit.

16. The semiconductor structure according to claim 5, wherein in one of the unit areas, preset depths of the grooves in the subunit areas are different, and/or preset widths of the grooves in the subunit areas are different, and/or preset opening densities of the grooves in the subunit areas are different.

17. The semiconductor structure according to claim 5, wherein the groove is filled with air.

18. The method of manufacturing a semiconductor structure according to claim 11, wherein in one of the unit areas, preset depths of the grooves in the subunit areas are different, and/or preset widths of the grooves in the subunit areas are different, and/or preset opening densities of the grooves in the subunit areas are different.

19. The method of manufacturing a semiconductor structure according to claim 13, wherein a band gap of the multi-quantum well material layer becomes wider as a growth temperature becomes higher; a larger a preset opening ratio of a subunit area, a longer a light-emitting wavelength of the light-emitting layer corresponding to the subunit area; a smaller the preset opening ratio of the subunit area, a shorter the light-emitting wavelength of the light-emitting layer corresponding to the subunit area.

20. The substrate according to claim 1, wherein a groove of one of the sub-unit areas is filled with air, and a groove of one of the sub-unit areas is filled with a thermally conductive material.

\* \* \* \* \*